United States Patent [19]

Kodaira

[11] Patent Number: 5,096,843
[45] Date of Patent: Mar. 17, 1992

[54] METHOD OF MANUFACTURING A BIPOLAR CMOS DEVICE

[75] Inventor: Yasunobu Kodaira, Tokyo, Japan

[73] Assignee: Kabushiki Kaisha Toshiba, Kawasaki, Japan

[21] Appl. No.: 523,358

[22] Filed: May 15, 1990

[30] Foreign Application Priority Data

Jun. 28, 1989 [JP] Japan .................................. 1-163687

[51] Int. Cl.⁵ .......................................... H01L 21/328
[52] U.S. Cl. ........................................ 437/31; 437/34; 437/38; 437/33; 437/67
[58] Field of Search ................... 437/67, 31, 32, 33, 437/38, 34, 26, 56, 57, 58, 228; 357/43

[56] References Cited

U.S. PATENT DOCUMENTS

| | | | |
|---|---|---|---|
| 4,520,552 | 6/1985 | Arnould et al. | 437/67 |
| 4,589,936 | 5/1986 | Komatsu et al. | 148/188 |
| 4,711,017 | 12/1987 | Lammert | 437/67 |
| 4,835,115 | 5/1989 | Eklund | 437/67 |
| 4,884,117 | 11/1989 | Neppl et al. | 357/43 |
| 4,965,220 | 10/1990 | Iwasaki | 437/59 |
| 4,975,764 | 12/1990 | Hsu | 357/43 |

Primary Examiner—Brian E. Hearn
Assistant Examiner—T. N. Quach
Attorney, Agent, or Firm—Banner, Birch, McKie & Beckett

[57] ABSTRACT

A well with a low impurity concentration is provided as a collector region on a semiconductor substrate. A trench is formed in a portion of the well from the surface toward the inside thereof. An insulating film, serving as a barrier against impurities, is formed on the side wall of the trench. Impurities are introduced through the trench and diffused to a high concentration into the well, thereby forming a high impurity concentration collector region which is connected to the collector electrode of the bipolar transistor. With the above-mentioned structure, the steps of diffusing antimony to a high concentration and growing an epitaxial silicon layer, which are indispensable to the prior art, are eliminated.

18 Claims, 3 Drawing Sheets

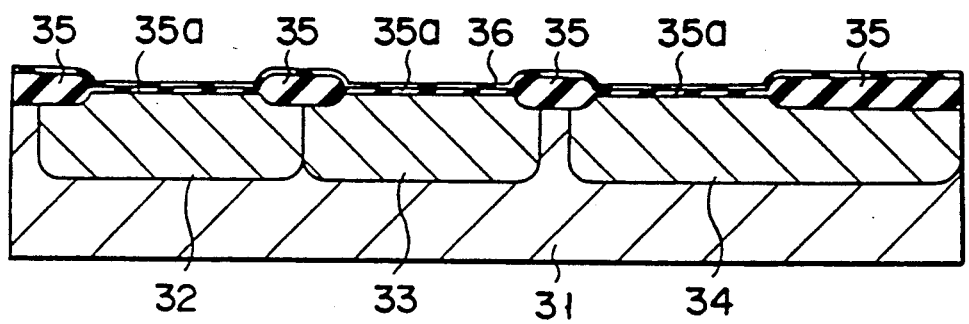
F I G. 2A
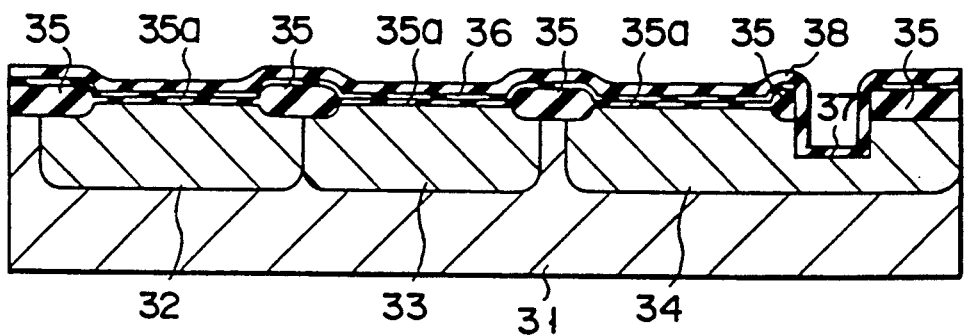
F I G. 2B
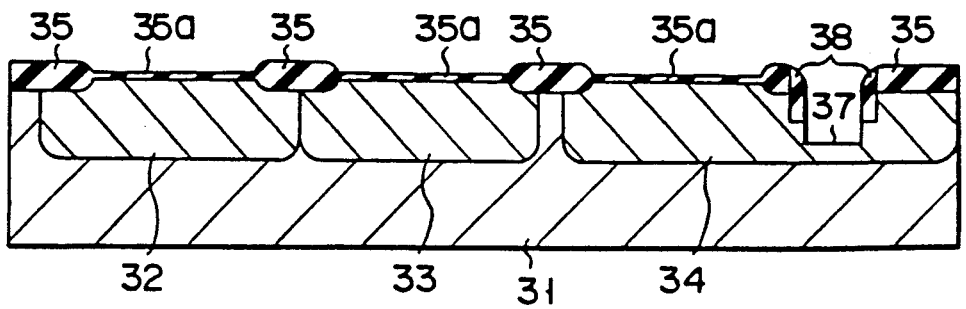
F I G. 2C

METHOD OF MANUFACTURING A BIPOLAR CMOS DEVICE

BACKGROUND OF THE INVENTION

1. Field of the Invention

This invention relates to a bipolar transistor and a method of manufacturing the same, and more particularly to a bipolar CMOS device and a method of manufacturing the same.

2. Description of the Related Art

Recently, due to the demand for high integration and high speed operation of semiconductor devices, BiCMOS devices, which are combinations of bipolar transistors and CMOS devices, have attracted public attention. The conventional method of manufacturing BiCMOS devices and drawbacks thereof will be described below with reference to FIGS. 1A to 1E.

FIGS. 1A to 1E show steps of forming the basic elements of a BiCMOS devices, i.e., an NMOS, PMOS, and an NPN bipolar transistor, on a same silicon substrate. First, as shown in FIG. 1A, an antimony diffusion layer 2 with a high concentration is formed within a selective region in the silicon substrate 1. Thereafter, an epitaxial silicon layer 3 is grown on the silicon substrate 1, so that the antimony diffusion layer 2 is buried. The epitaxial silicon layer has to be low impurity concentration so as to form NMOS and PMOS transistors together with a bipolar transistor, as will be explained later.

Next, as shown in FIG. 1B, a P-well 5, an N-well 6 and a bipolar N-well 7 are formed in the epitaxial silicon layer 3 by means of ion implantation and thermal diffusion. Subsequently, field insulating films 4 are formed between the adjacent well regions by selective oxidation method. Thereafter, a deep N+-diffusion layer 8 is formed so as to reach the antimony diffusion layer 2 by ion implantation and thermal diffusion. The N+-diffusion layer 8 is to be connected to the collector electrode of the bipolar transistor in order to decrease the collector resistance. Then, channel ions are injected into the well regions so as to control the impurity concentrations of the channels, in order to adjust the threshold voltages of the NMOS transistor and the PMOS transistor.

Thereafter, as shown in FIG. 1C, after forming a gate oxide film, a polysilicon film is deposited by the LPCVD method, and unnecessary portions of the polysilicon film are removed by photolithography and reactive ion etching. As a result, an NMOS gate 9 and a PMOS gate 10 are formed. Subsequently, a P--base layer 13 is formed by ion implantation, then an NMOS N+-diffusion source 9a, an NMOS N+-diffusion drain layer 9b, a PMOS P+-diffusion source layer 10a, a PMOS P+-diffusion drain layer 10b, a P+-base layer 11 and a N+-collector layer 12 are formed by ion implantation. The regions in which ion implantation is not performed are covered with a resist film, then a first interlayer insulating film 14 is deposited on the entire surface by a CVD method.

Then, as shown in FIG. 1D, an opening is formed in that portion of the first interlayer insulating film 14 where the emitter of the bipolar transistor is to be formed and polysilicon is deposited in the opening to form an emitter. The polysilicon layer thus formed is patterned by photolithography and reactive ion etching, thus forming an emitter polysilicon layer 15. N-type impurity such as phosphorus are injected into the emitter polysilicon layer 15 by ion implantation, and diffused within the P--base layer 13. Thus, an N+-diffusion emitter layer 16 is formed.

Next, as shown in FIG. 1E, a second interlayer insulating film 17 is deposited on the entire surface. Openings are formed in the portions of the film 17 in which electrodes are to be formed. An NMOS source electrode 18a, an NMOS drain electrode 18b, a PMOS source electrode 19a, a PMOS drain electrode 19b, a emitter electrode 20a, a base electrode 20b, and a collector electrode 20c are formed via the openings. An insulative protecting film 21 is then deposited on the entire surface. Thus, NMOS, PMOS, and NPN bipolar transistors are obtained. The antimony diffusion layer 2 with a high concentration and the N+-diffusion layer 8 lower a collector resistance of the bipolar transistor and thus function as a low-resistant electrode wiring.

The most difficult drawback of the above conventional method is that, in order to lower the collector resistance of the bipolar transistor, the antimony diffusion layer 2 and the epitaxial silicon layer 3 must be formed. Since the steps of forming these layers are added to the steps of forming the CMOS devices, the manufacturing costs increase. In addition, the step of growing the epitaxial silicon layer 3 requires a difficult technique. More specifically, the epitaxial silicon layer 3 must be completely crystallized and accurately formed to a desired thickness, and the impurity concentration also must be controlled accurately. It is very difficult to maintain the crystallization of the epitaxial silicon layer 3, so that defects such as stacking faults frequently occur. These defects result in the low yield and low reliability of the device.

SUMMARY OF THE INVENTION

This invention has been made to overcome the abovedescribed drawbacks of the conventional method of manufacturing a BiCMOS device, and its object is to provide a high-quality bipolar transistor, to be used especially in a BiCMOS device, and a method of manufacturing the same, in which the region corresponding to the buried layer in the conventional device, such as the antimony diffusion layer, can be formed without growing an epitaxial silicon layer.

The bipolar transistor of the present invention comprises: a semiconductor substrate of a first conductivity type; a collector well region with a low impurity concentration of a second conductivity type formed on the semiconductor substrate; a trench formed in a portion of the collector well region from the surface toward the inside thereof; a high impurity concentration collector region formed as a buried layer by introducing and diffusing impurities of the second conductivity type into the collector well region through the trench to a high concentration; an emitter region of the second conductivity type formed on the collector well region and above the high impurity concentration collector region; and a base region of the first conductivity type formed on the collector well region.

The method of forming the bipolar transistor of the present invention comprises the steps of: forming a collector region of a second conductivity type on a semiconductor substrate of a first conductivity type; forming a trench in a portion of the surface of the collector region; forming an insulating film on the side wall of the trench., introducing impurities of the second conductivity type into the collector region through the trench, thereby forming a high impurity concentration collector region as a buried layer; forming a base region of the first conductivity type on the semiconductor substrate; and forming an emitter region of the second conductivity type above the high impurity concentration collector region on the semiconductor substrate.

According to the present invention, a trench provided with an insulating film on its side wall is formed in the semiconductor substrate. Since the insulating film serves as a barrier when impurities are introduced therethrough and diffused to derive a collector electrode of the bipolar transistor, it is unnecessary to perform an antimony diffusion step and an epitaxial silicon layer growing step, which are indispensable to the conventional method. Thus, the drawbacks of the conventional method can be overcome.

Additional objects and advantages of the invention will be set forth in the description which follows, and in part will be obvious from the description, or may be learned by practice of the invention The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1A:
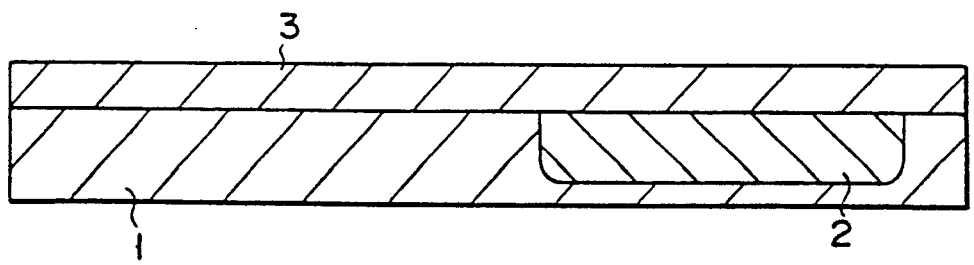
FIGS. 1A, 1B, 1C, 1D, and 1E show the steps of manufacturing a conventional bipolar transistor.
Figure 1B:
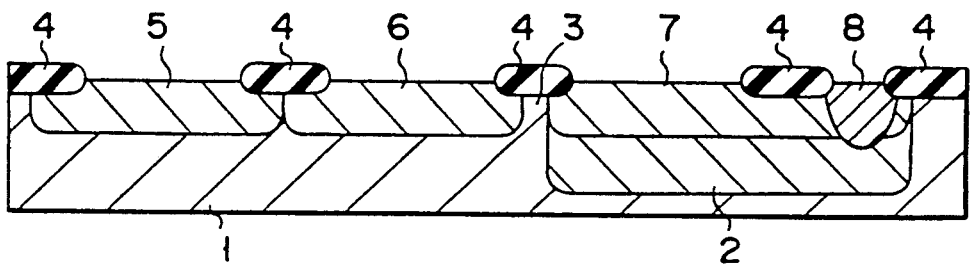
Figure 1C:
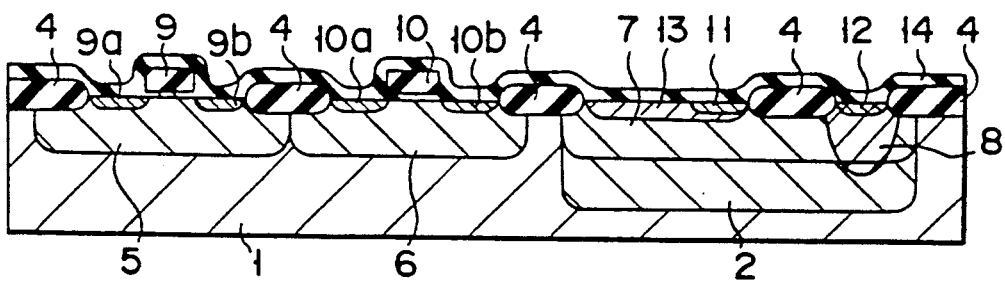
Figure 1D:
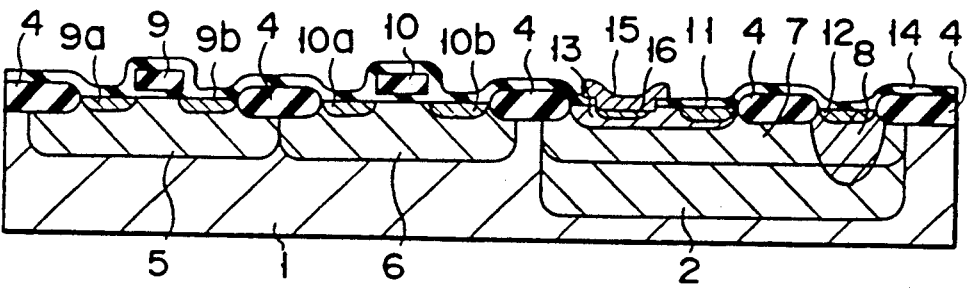
Figure 1E:
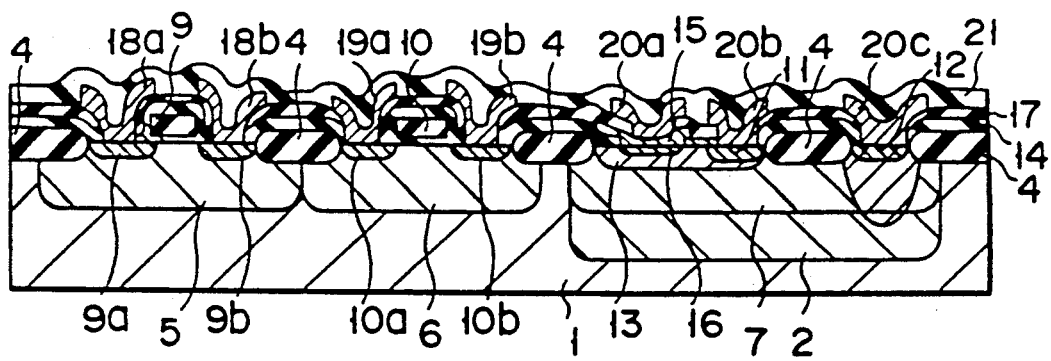

The bipolar transistor of the present invention and the method of manufacturing the same will be described below with reference to FIGS. 2A to 2C. In the following embodiment, the present invention is applied to an NMOS transistor and a PMOS transistor, which are basic constituent devices of a BiCMOS transistor.

First, as shown in FIG. 2A, impurities are introduced in a P-type silicon substrate 31 by ion implantation to form an NMOS P-well 32, a PMOS N-well 33, and a bipolar N-well 34. Phosphorous, for example, is used as an N-type impurity. The impurity concentration of the N-well 34 is 1 to $2 \times 10^{16}$ 1/cm$^3$ or more. Then a field insulating film 35 is formed by selective oxidation according to the coplanar method. Thereafter, a silicon oxide film 35a of about 500 Å thickness is formed on the surface of the silicon substrate 31 by heat oxidation method, and a silicon nitride film 36 of about 500 Å thickness is formed on the silicon oxide film 35a by means of an ordinary low pressure CVD method. The silicon nitride film 36 serves as an etching stopper when etching is performed later.

Second, as shown in FIG. 2B, a trench 37 of about 10000 Å depth is formed in the bipolar N-well region 34 through the silicon nitride film 36 and the field insulating film 35 by means of photolithography and reactive ion etching, a CDE method, or a wet etching method. The depth of the trench 37 is determined so that the deep N+-diffusion collector layer 40 (to be described later) does not reach the P⁻-base layer 45 (to be described later). The technique for forming a trench has been established in the technique of manufacturing the megabit DRAM. Next, a CVD silicon oxide film 38 is deposited on the entire surface of the silicon substrate 31 to a thickness of 4000 Å. The silicon oxide film 38 is an insulating film which serves as a barrier to prevent impurities from being introduced into an undesired portion when impurities are introduced through the trench 37 into the bipolar N-well 34 in a later step.

Next, as shown in FIG. 2C, the CVD silicon oxide film 38 is etched back by reactive ion etching, so that the oxide film 38 is removed except for the portion on the side wall of the trench 37. At this time, the CVD silicon oxide film 38 on the bottom of the trench 37 is also removed. Thereafter, the trench 37 is further dug down about 10000 Å by reactive ion etching. The wall portion which appears due to the additional digging is utilized later to diffuse impurities into the bipolar N-well 34 horizontally, and the depth of the additional digging is determined in accordance with the amount of impurities to be diffused. Since the silicon nitride film 36 differs from the CVD silicon oxide film 38 and the bipolar N-well 34 in selection ratio of reactive ion etching, it serves as an etching stopper when the trench 37 is further dug down. If the silicon nitride film 36 is not provided, the field insulating film 35 is also etched at the same time as the etching of the CVD silicon oxide film 38. Thereafter, the silicon nitride film 36 is removed.

Figure 2D:
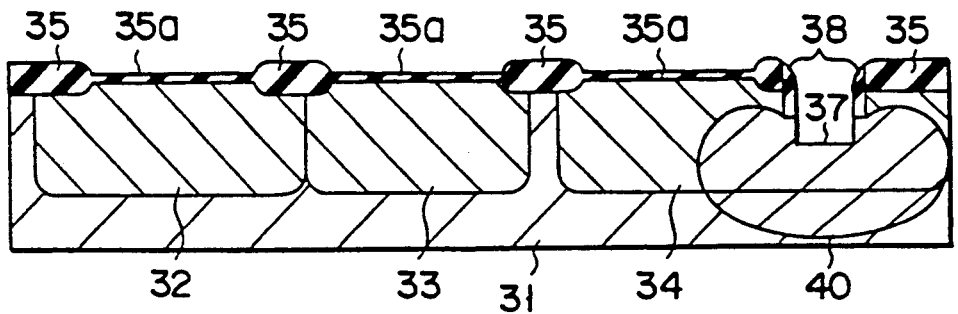
FIGS. 2A, 2B, 2C, 2D, 2F and 2G show the steps of manufacturing the bipolar transistor according to the present invention.

Subsequently, as shown in FIG. 2D, an N+-type impurity such as phosphorus is introduced by means of photolithography and ion injection to a high concentration into the bipolar N-well 34 through the bottom and the portion of the wall of the trench 37 which is not covered by the CVD silicon oxide film 38. The N+- type impurity is diffused in the bipolar N-well 34 by thermal diffusion, thus forming a deep N+-diffusion collector layer 40. The concentration of the layer 40 is, for example, 1 to $2 \times 10^{19}$ 1/cm$^3$. Channel impurities for adjusting the threshold voltages of the NMOS and PMOS transistors are introduced into the well regions by ion injection and, thereafter, gates are formed. Since the threshold voltage is determined by the impurity concentration ration, impurities are injected into the P-well 32 for forming an NMOS transistor and the N-well 33 for forming a PMOS transistor, independently of each other.

Figure 2E:
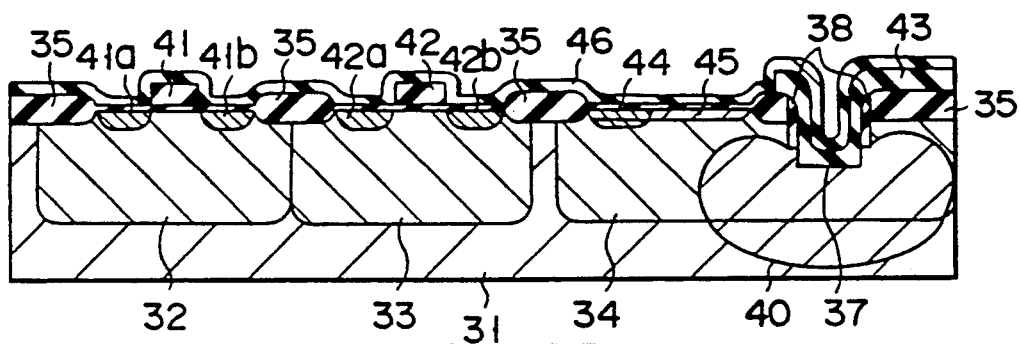

Then, as shown in FIG. 2E, polysilicon layer is deposited to about 4000 Å on the substrate and the polysilicon layer is patterned to form an NMOS gate 41, a PMOS gate 42, and a polysilicon collector electrode 43. Using photolithography and ion injection, an NMOS source 41a, an NMOS drain 41b, a PMOS source 42a, a PMOS drain 42b, a P+-base electrode layer 44, and P⁻-base layer 45 are formed respectively The P⁻-base layer 45 is formed by means of ion injection in which P-type impurity, for example, boron is injected to an implant amount $2 \times 10^{13}$1.cm$^3$ at accelerating voltage 25KV. In the P⁻-base layer 45, an emitter will later be formed. Subsequently, a first interlayer insulating film 46 is deposited on the entire surface.

Figure 2F:
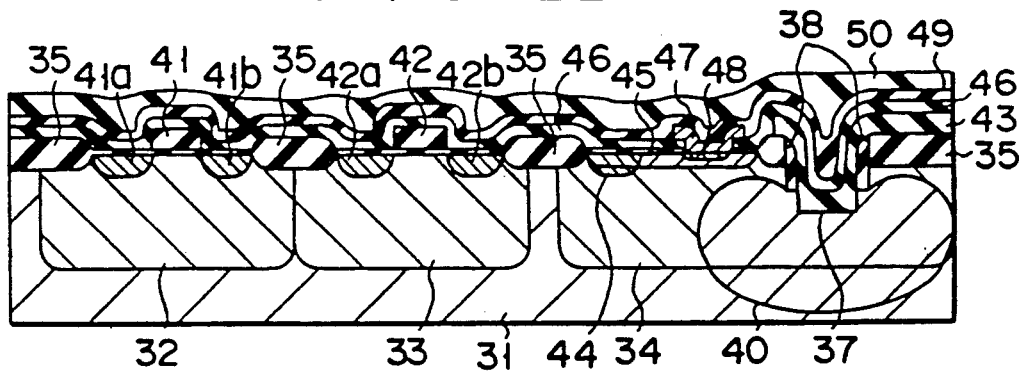

Next, as shown in FIG. 2F, an opening is formed in the first interlayer insulating film 46 on the P⁻-base layer in the bipolar N-well 34. Polysilicon is deposited to about 2000 Å on the whole surface. The polysilicon layer is then patterned by means of photolithography and reactive ion etching so as to form a polysilicon emitter 47, into which N-type impurities such as arsenic are introduced by means of ion injection up to an implant amount $5 \times 10^{15}$ 1/cm³ at accelerating voltage 50 KV, then diffused into the P--base layer 45 by thermal diffusion, thereby forming an N+-emitter layer 48. Thereafter, a second interlayer insulating film 49 is deposited on the surface, and, to even the entire surface, a third interlayer insulating film 50 is formed thereon.

Figure 2G:
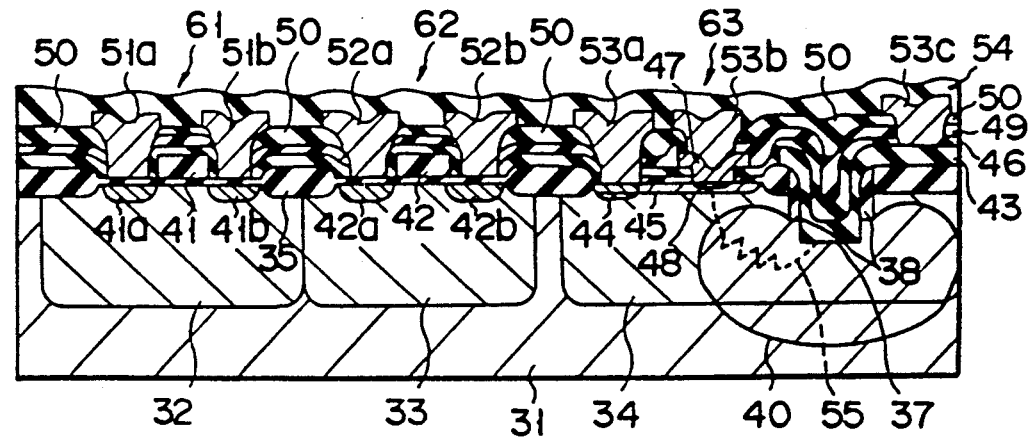

Then, as shown in FIG. 2G, contact holes for connecting the electrodes are formed in the interlayer insulating films. Aluminum layer is deposited and patterned to form an NMOS source electrode 51a, an NMOS drain electrode 51b, a PMOS source electrode 52a, a PMOS drain electrode 52b, a base electrode 53a, an emitter electrode 53b, and a collector electrode 53c. An insulating protection film 54 is then formed on the entire surface. Thus, an NMOS transistor 61, a PMOS transistor 62, and an NPN bipolar transistor 63, which are the basic devices of a BiCMOS transistor, are formed on the same silicon substrate 31.

In order to improve the characteristics of the bipolar transistor, the external voltage applied between the base and the portion collector should be applied to a junction portion of the base and the collector, while suppressing the voltage drop due to the collector resistance. Since the N+-diffusion collector layer 40 has a low resistance due to the high concentration of impurities therein, the collector resistance of the NPN bipolar transistor 63 which is schematically shown by a broken line 55 between the N+-emitter layer 48 and the collector electrode 43 in FIG. 2G become also low. Since the external voltage applied between the base an collector is directly applied to the junction portion of the base and the collector of the transistor 63 with suppressing the voltage drop due to the collector resistance by virtue of the low collector resistance, the characteristics of the transistor are improved. If the collector resistance were high, a PNP parasitic bipolar transistor, which is constituted by the P-type silicon substrate 31, the bipolar N-well 34 and the P--base layer 45, would tend to be activated. If the PNP parasitic bipolar transistor is activated, the bipolar transistor 63 will not function, since a large current will be allowed to flow into the P-type silicon substrate 31. The PNP parasitic bipolar transistor is prevented from being turned on by virtue of the low collector resistance.

As is obvious from the above embodiment, it is unnecessary to perform the steps of forming a antimony diffusion layer 2 and an epitaxial silicon layer 3, which are indispensable for the prior art method to lower the collector resistance of the bipolar transistor. In contrast, according to the present invention, the trench 37 is formed in the silicon substrate 31, and the impurities are directly introduced through the trench into the bipolar N-well 34 with low impurity concentration, thereby lowering the collector resistance of the bipolar transistor. To prevent the impurities from being introduced into undesired portions, the silicon oxide film 38 is provided on the side wall of the trench.

Thus, according to the present invention, the manufacturing steps are considerably simplified in comparison with the prior art method. In addition, the drawbacks caused by the incomplete crystallization of the epitaxial silicon layer 3 are prevented. Therefore, the manufacturing cost can be greatly reduced and the yield and the reliability of the device can be improved.

This invention is not limited to the above embodiment, but can be variously modified. For example, in the above embodiment, the trench 37 is further dug down in order to allow the impurities to be easily introduced into the side portions of the bipolar N-well region after etching back the CVD silicon oxide film 38. However, the impurities can be introduced through the trench 37 into the bipolar N-well 34 without additional digging after the etching back. Further, in the above embodiment, the NPN bipolar transistor is formed, but a PNP bipolar transistor can be formed in a similar process. In this case, the bipolar N-well 34 is replaced by a bipolar P-well, the deep N+-diffusion collector layer 40 is replaced by a deep P+-diffusion collector layer. Accordingly, P-type impurities, for example, boron should be introduced through the trench 37, the P+-base electrode is replaced by a N+-base electrode and the N+-emitter is replaced by a P+-emitter. Therefore, P-type impurities, for example, boron should be introduced into the emitter 47 made of polysilicon. Moreover, in the above embodiment, the N+-emitter layer 48 is formed by diffusing impurities via the polysilicon emitter 47. However, an N+-emitter layer (or P+-layer in a PNP bipolar transistor) can be formed by ion injection or the like, not via the emitter 47.

As has been described above, according to the present invention, since the collector layer with the low resistance is formed below the emitter by virtue of the insulating film provided on the side wall of the trench, the high concentration buried layers 2, the low concentration epitaxial silicon layer 3, and the high concentration layer 8 of the conventional bipolar transistor need not be formed. Therefore, a bipolar transistor of high reliability can be formed in the simple manufacturing steps, with low cost at high yield.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a bipolar transistor comprising the steps of:

forming a collector well region of a first conductivity type in a semiconductor body of a second conductivity type;

forming a trench in a portion of said collector well region;

introducing impurities of the first conductivity type into said collector well region through said trench to form a high impurity concentration collector region;

forming a base region of the second conductivity type in said semiconductor body;

forming an emitter region of the first conductivity type in said semiconductor body; and forming a collector electrode to directly contact said high impurity concentration collect region.

2. A method of manufacturing a bipolar transistor according to claim 1, wherein the step of introducing impurities into the collector well region to a high concentration is performed by means of thermal diffusion.

3. A method of manufacturing a bipolar transistor according to claim 1, further wherein said collector electrode is formed within said trench.

4. A method of manufacturing a bipolar transistor according to claim 1, further comprising the step of forming an insulating film on a side wall of said trench prior to introducing impurities of the first conductivity type into the collector well region.

5. A method of manufacturing a bipolar transistor according to claim 4, further comprising a step of further etching the trench after the step of forming an insulating film.

6. A method of manufacturing a bipolar transistor according to claim 1, wherein said emitter region is formed at a level above a level of said high impurity concentration collector region.

7. A method of manufacturing a bipolar transistor according to claim 1, wherein said high impurity concentration collector region is formed to extend at least partially below said trench.

8. A method of manufacturing a bipolar transistor according to claim 1, wherein said trench is formed to be substantially surrounded by said collector well region.

9. A method of manufacturing a bipolar transistor according to claim 1, wherein said trench is formed about a vertical axis which is substantially perpendicular to the surface of said semiconductor body, and wherein said high impurity concentration collector region is formed as a generally uniform distribution of impurities about said axis.

10. A method of manufacturing a bipolar transistor for a BiCMOS device including bipolar and MOS elements, the method comprising the steps of:
  forming a collector well region of a first conductivity type in a semiconductor body of a second conductivity type;
  forming a trench in a portion of said collector well region;
  introducing impurities of the first conductivity type into said collector well region through said trench to form a high impurity concentration collector region, said high impurity concentration region permitting interaction between said bipolar transistor and other elements on said semiconductor body;
  forming a base region of the second conductivity type in said semiconductor body; and
  forming an emitter region of the first conductivity type in said semiconductor body.

11. A method according to claim 10 wherein said high concentration impurity region is formed to extend into the semiconductor body below the collector well region.

12. A method according to claim 10, further comprising the step of forming an NMOS transistor within said semiconductor body for use in conjunction with said bipolar transistor.

13. A method according to claim 10, further comprising the step of forming an PMOS transistor within said semiconductor body for use in conjunction with said bipolar transistor.

14. A method according to claim 10 further comprising the step of forming an insulating film on a side wall of said trench prior to introducing impurities of the first conductivity type into said collector well region.

15. A method according to claim 14, further comprising the step of:
  further etching the trench after the step of forming an insulating film.

16. A method according to claim 10, further comprising the step of:
  forming a collector electrode to directly contact said high impurity concentration region.

17. A method according too claim 10, wherein said collector electrode is formed within said trench.

18. A method according to claim 10, wherein the step of introducing impurities into the collector well region to a high concentration is formed by means of thermal diffusion.

* * * * *